United States Patent [19]
Mimoto

[11] Patent Number: 5,027,174
[45] Date of Patent: Jun. 25, 1991

[54] SEMICONDUCTOR INTEGRATED CIRCUIT DEVICE WITH IMPROVED RESISTANCE AGAINST ELECTROSTATIC NOISE

[75] Inventor: Toshio Mimoto, Nara, Japan
[73] Assignee: Sharp Kabushiki Kaisha, Osaka, Japan
[21] Appl. No.: 489,792
[22] Filed: Mar. 5, 1990

Related U.S. Application Data

[63] Continuation of Ser. No. 384,874, Jul. 21, 1989, abandoned, which is a continuation of Ser. No. 228,381, Aug. 4, 1988, abandoned.

[30] Foreign Application Priority Data

Aug. 25, 1987 [JP] Japan .................................. 62-212130

[51] Int. Cl.$^5$ .......................... H01L 29/06; H02H 9/00
[52] U.S. Cl. ...................................... 357/23.13; 357/59; 361/56
[58] Field of Search ......................... 357/23.13, 59, 51; 361/56, 91

[56] References Cited

U.S. PATENT DOCUMENTS 4,710,791 12/1987 Shirato et al. ..................... 357/23.13

FOREIGN PATENT DOCUMENTS 58-123767 7/1983 Japan ................................. 357/23.13

Primary Examiner—Mark Prenty
Attorney, Agent, or Firm—Irell & Manella

[57] ABSTRACT

A semiconductor integrated circuit device has an internal circuit formed on a semiconductor substrate and a first conductive layer connected to an electrode pad for communicating signals with the internal circuit. This first conductive layer may cross another signal line above or below but the insulative film which separates them includes a conductive layer in electrically floating condition such that the insulative film is protected against externally applied electrostatic noise on the electrode pad.

4 Claims, 3 Drawing Sheets

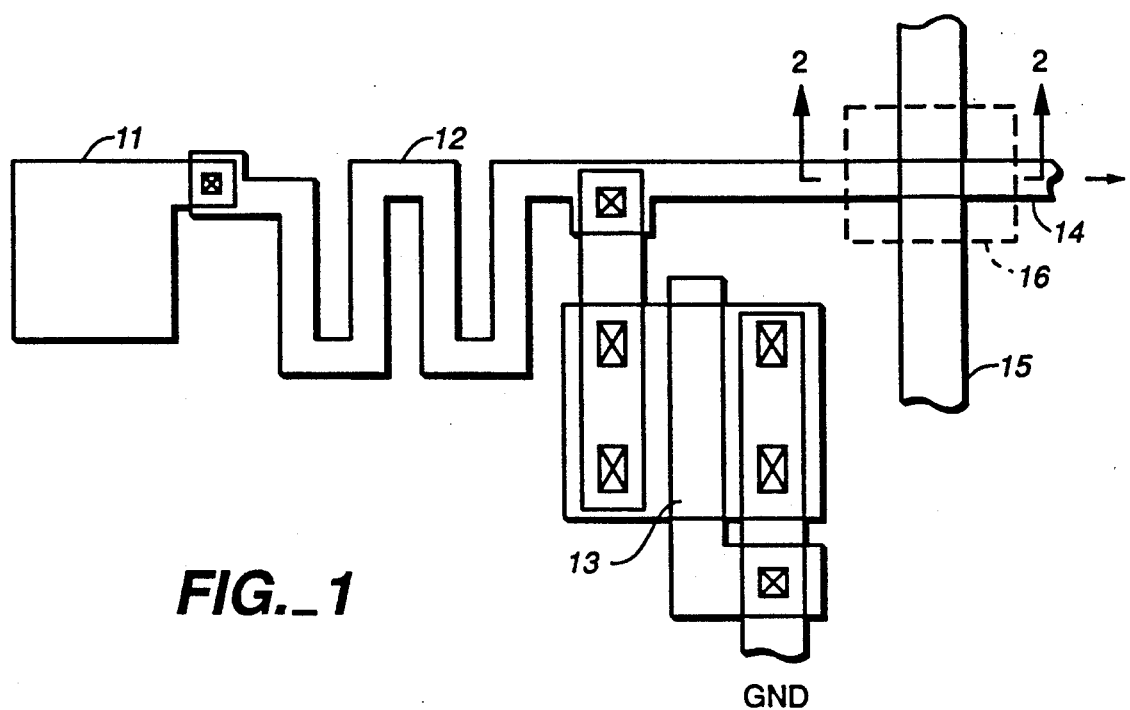
FIG._1
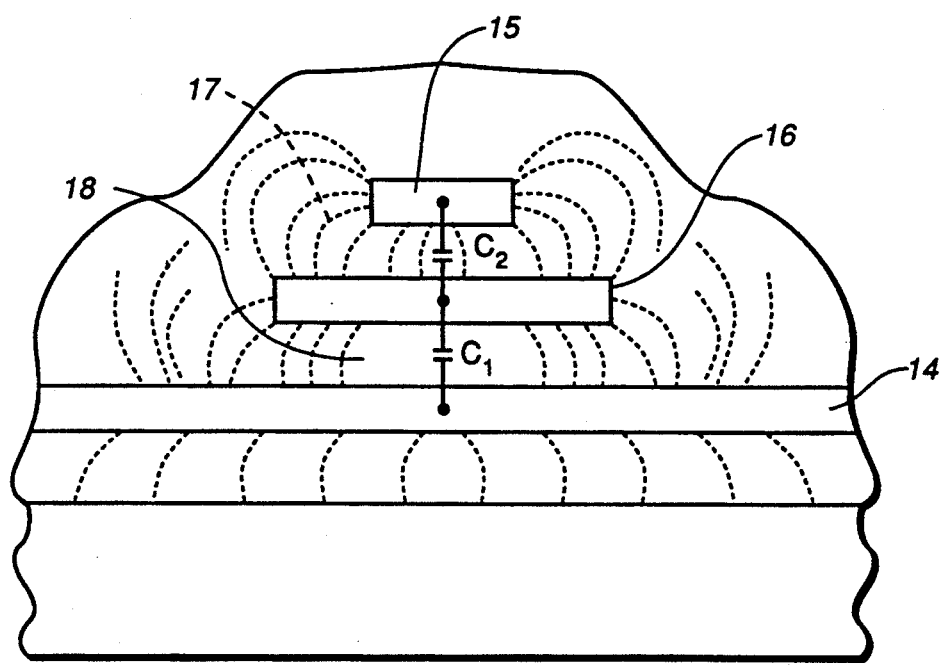
FIG._2

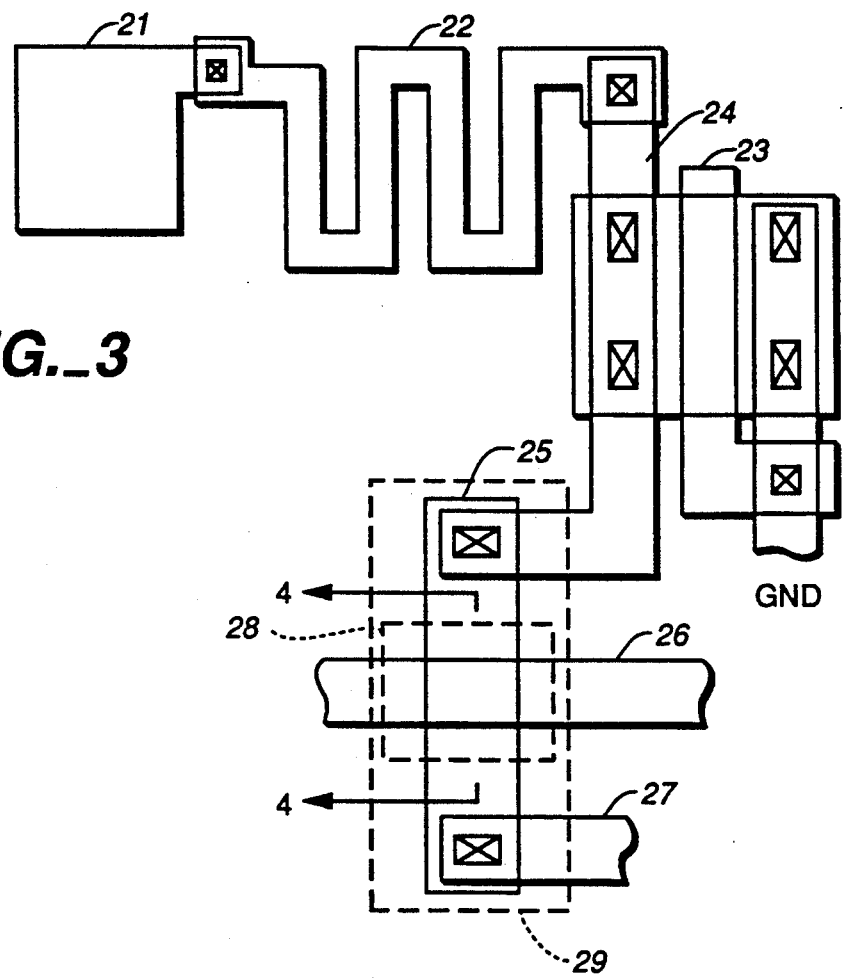
FIG._3
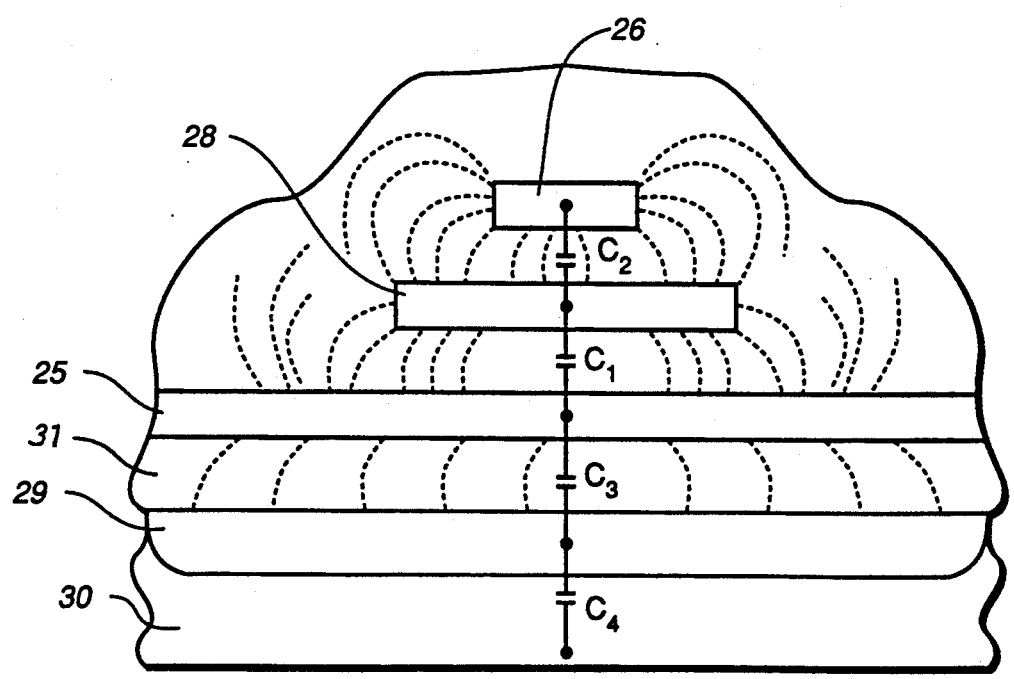
FIG._4

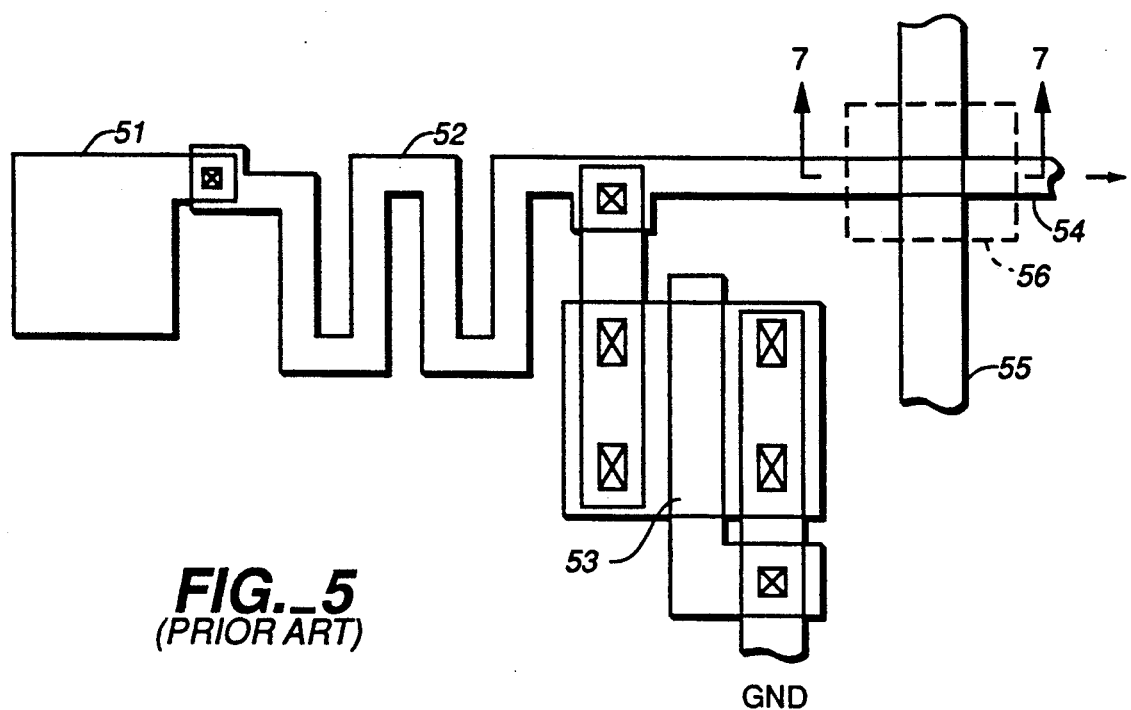
FIG._5
*(PRIOR ART)*
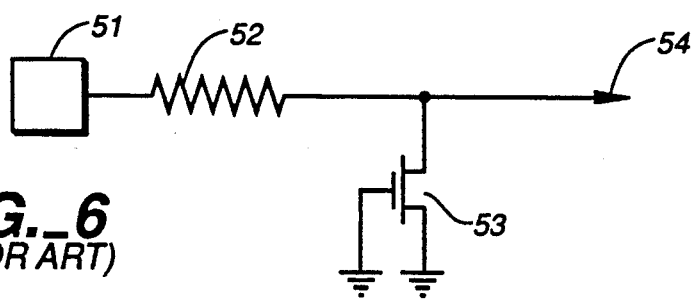
FIG._6
*(PRIOR ART)*
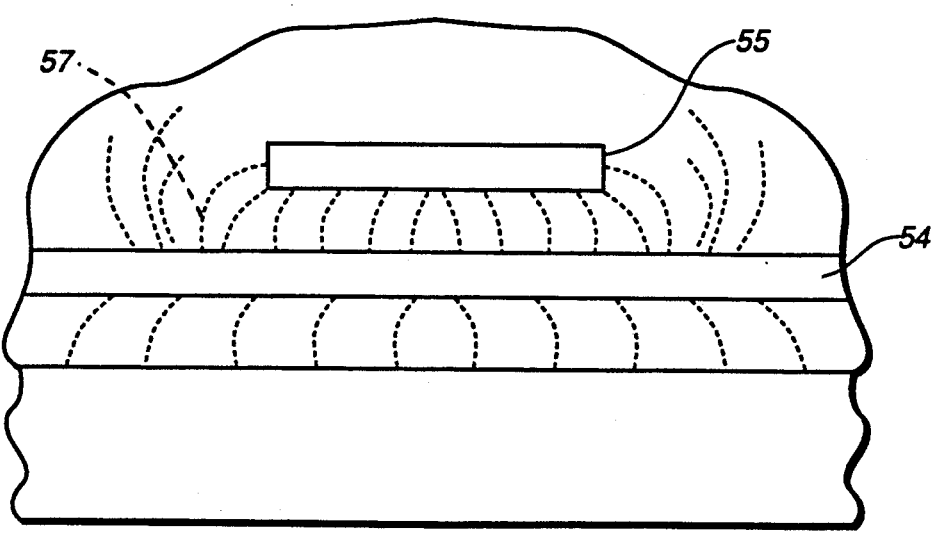
FIG._7
*(PRIOR ART)*

SEMICONDUCTOR INTEGRATED CIRCUIT DEVICE WITH IMPROVED RESISTANCE AGAINST ELECTROSTATIC NOISE

This is a continuation of application Ser. No. 384,874 filed July 21, 1989 and now abandoned, which is a continuation of application Ser. No. 228,381 filed Aug. 4, 1988 and now abandoned.

BACKGROUND OF THE INVENTION

This invention relates to a semiconductor integrated circuit device with high resistance against external electrostatic noise.

With semiconductor integrated circuit devices, damage due to electrostatic noise applied through package terminals is a serious problem. For this reason, protective circuits of various types have been considered. FIG. 5 is a pattern diagram of a prior art protective circuit of a commonly used kind. In FIG. 5, numeral 51 indicates an electrode pad for receiving a signal, numeral 52 indicates a protective resistor comprising polysilicon in a conductive layer above a semiconductor substrate (not shown) and numeral 53 indicates a protective transistor. The received signal is introduced into an internal circuit through a conductive polysilicon line 54. An equivalent circuit of this protective circuit is shown in FIG. 6.

In a real large scale integrated circuit, however, it is hardly avoidable that the polysilicon line 54 cross another signal line (such as a metallic layer) 55 as shown in FIG. 5 because there are many signal lines near the electrode pad 51. In FIG. 5, numeral 56 indicates the area at which the polysilicon line 54 and the signal line 55 cross each other. Sectionally, this crossing area 56 looks as shown in FIG. 7 wherein numeral 57 indicates an insulative film.

When an electrostatic noise is applied to the electrode pad 51, it is attenuated at the contact part of the polysilicon line 54 with the internal circuit because of the protective resistor 52 and transistor 53 but it is not possible to completely remove the electrostatic noise from the polysilicon line 54 and it is particularly difficult if the resistance of the protective resistor is small. If a strong electric field is induced at the crossing area 56 between the polysilicon line 54 and another signal line 55, there is an increased possibility of electrostatic damage at such an area.

SUMMARY OF THE INVENTION

It is therefore an object of the present invention to provide a semiconductor integrated circuit device with increased resistance against electrostatic noise.

In view of the above and other objects, a semiconductor integrated circuit device embodying the present invention is characterized as having on a semiconductor substrate not only a conductive layer which is connected to a signal inputting and/or outputting electrode pad and crosses another conductive layer but also a third conductive layer which is in an electrically floating condition and is disposed within an insulating film between these conductive layers. Such a third layer has the effect of attenuating a strong electric field which would otherwise be generated between the mutually crossing layers.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a pattern diagram showing a structure embodying the present invention, FIG. 2 is a sectional view showing this sectional structure taken along the line 2—2 of FIG. 1, FIG. 3 is a pattern diagram showing another structure embodying the present invention, FIG. 4 is a sectional view showing the sectional structure taken along the line 4—4 of FIG. 3, FIG. 5 is a pattern diagram showing the structure of a prior art protective circuit, FIG. 6 is an equivalent circuit diagram of the protective circuit of FIG. 5, and FIG. 7 is a sectional view taken along the line 7—7 of FIG. 5.

DETAILED DESCRIPTION OF PREFERRED EMBODIMENTS

With reference to Fig. I which shows a protective circuit embodying the present invention for an active circuit region formed above a semiconductor substrate, numeral 11 indicates an electrode pad for receiving a signal for a large scale integrated circuit or transmitting a signal therefrom. Electrostatic noise generated externally from this active circuit is likely to be applied to this electrode pad 11, for example, from a package lead line through a bonding wire. Numeral 12 indicates a protective resistor comprised of polysilicon. Numeral 13 indicates a protective transistor of which the gate and the source are grounded (GND) and the drain is connected to one end of the protective resistor 12. Numeral 14 indicates a conductive line which is connected to the internal circuit and comprises polysilicon like the protective resistor 12. Numeral 15 indicates another signal line comprising a metallic layer which crosses the aforementioned polysilicon line 14. Numeral 16 indicates a conductive layer of polysilicon in another layer which is in a floating condition and formed within an insulative film between the aforementioned signal line 15 and the polysilicon line 14. Its shape may coincide with the part of the polysilicon line 14 which crosses the signal line 15 or may be such that this crossing area is completely covered as shown in FIG. 1.

FIG. 2 shows the sectional structure where the lines 14 and 15 cross each other. When electrostatic noise is applied to the electrode pad 11 and a high voltaqe $V_S$ is generated on the line 14, the voltage which is induced in the floating conductive layer 16 is determined by the capacitance $C_1$ and $C_2$ shown in FIG. 2. If the signal line 15 is assumed grounded for convenience, the induced voltage $V_E$ in the floating conductive layer 16 is $C_1 V_S/(C_1+C_2)$ and this is the voltage difference across the insulative film 17 between the mutually crossing lines 15 and 16. This is to be contrasted with the prior art circuit shown in FIG. 7 where a voltage difference of $V_S$ will result between the signal line 55 and the polysilicon line 54 under a similar condition. Since the insulative film 17 of FIG. 2 and that 57 of FIG. 7 would be about the same, the field intensity across the insulative film 17 would be $C_1/(C_1+C_2)$ of the prior art situation. In other words, the insulative film 17 according to the present invention is likely to be electrostatically damaged. Even if the insulative film 17 between the signal line 15 and the floating conductive layer 16 or the insulative film 18 between the floating conductive layer 16 and the polysilicon line 14 is damaged, there is no adverse effect on the electrical properties because the conductive layer 16 is in floating condition.

In FIG. 3 which shows another embodiment of the present invention, numeral 21 indicates an electrode pad on an large scale integrated circuit, numeral 22 indicates a protective resistor comprising a polysilicon layer, numeral 23 indicates a protective transistor, numeral 24 indicates a connecting line comprising a metallic layer and numeral 25 indicates a polysilicon line which crosses a signal line 26 comprising a metallic layer and one end of which is connected to an internal circuit through another metallic line 27. Numeral 28 indicates a conductive layer embodying the present invention which comprises polysilicon and is in floating condition. This floating conductor layer 28 is formed within an insulative film between the aforementioned polysilicon line 25 and the metallic layer 26 and may be shaped to coincide with the part of the polysilicon layer 25 which crosses the metallic layer 26 or to completely cover the crossing area. Numeral 29 indicates a diffusion layer also in floating condition and having opposite polarity (conduction type) to the substrate 30. This diffusion layer 29 may be shaped exactly the same as the polysilicon line 25 or so as to completely cover it.

With reference to FIG. 4 which shows the sectional structure of the crossing part of the polysilicon line 25 and the metallic signal line 26, the floating conductive layer 28 is understood to protect the insulation between the polysilicon line 25 and the metallic signal line 26 against electrostatic noise as explained above in connection with FIGS. 1 and 2. The embodiment shown in FIGS. 3 and 4 is characterized as being capable of further improving the protection of the insulative film between the polysilicon line 25 and the substrate 30.

Assume, for example, that the substrate 30 is a p-type substrate and that the diffusion layer 29 is an n-type layer. If a positive electrostatic noise is applied to the polysilicon line 25, the field intensity across the insulative film 31 between the diffusion layer 29 and the polysilicon line 25 is substantially reduced because of the double capacitive coupling (series connection of the capacitance $C_3$ of the insulative film between the polysilicon line 25 and the surface of the substrate 30 and the connection capacitance $C_4$ between the n-type diffusion layer 29 and the p-type substrate 30) with the p-type substrate 30 provided by the n-type diffusion layer 29. If a negative electrostatic noise is applied, the n-type diffusion layer 29 and the p-type substrate 30 are biased in the normal direction and the possibility of damage is large because all voltages are applied to the insulative film 31, but even if this insulative film 31 is damaged, the polysilicon line 25 is shorted only to the floating n-type diffusion layer 29 and since the n-type diffusion layer 29 and the p-type substrate 30 are of opposite polarity under normal operating conditions, the electrical characteristics of the circuit are not affected.

The foregoing description of preferred embodiments of the invention has been presented for purposes of illustration and description. It is not intended to be exhaustive or to limit the invention to the precise form disclosed and many modifications and variations are possible in light of the above teaching. For example, the aforementioned first and second conductive layers may comprise a diffusion layer formed on the surface of the substrate. In summary, the present invention makes it possible to cross an electrode pad signal line with any other signal lines without fear of electrostatic noise and significantly expand the degree of freedom in designing a large scale integration pattern.

What is claimed is:

1. A line-crossing structure in a semiconductor integrated circuit device comprising:

a semiconductor substrate, a first insulative film formed on said semiconductor substrate, a first conductive line formed on said first insulative film, said first conductive line having a first end and a second end, said first end being connected through a first connecting line to an internal circuit of said device and said second end being connected through a second connecting line to an input protection circuit which is connected to an electrode pad for communicating signals with said internal circuit, and said first and second connecting lines being farther away from said substrate than said first conductive line, a second conductive line which crosses above said first conductive line inside said line-crossing structure, a second insulative film between said first and second conductive lines where said first and second conductive lines cross each other, a conductive layer which is disposed between said first and second conductive lines and completely surrounded by said second insulative film so as to be in electrically floating condition, and a diffusion layer formed in a surface region of said substrate so as to completely overlap said first conductive line.

2. The line-crossing structure of claim 1 wherein said diffusion layer is also in electrically floating condition.

3. The line-crossing structure of claim 1 wherein said diffusion layer and said substrate are of opposite conductivity types.

4. The line-crossing structure of claim 1 wherein said second conductive line and said first and second connecting lines comprise a metallic material and said first conductive line comprises polysilicon.

* * * * *